(12) United States Patent
Near

(10) Patent No.: US 9,294,014 B2
(45) Date of Patent: Mar. 22, 2016

(54) POWER GENERATOR

(71) Applicant: Genziko, Incorporated, Alpharetta, GA (US)

(72) Inventor: Craig D. Near, Alpharetta, GA (US)

(73) Assignee: Genziko Incorporated, Alpharetta, GA (US)

( * ) Notice: Subject to any disclaimer, the term of this patent is extended or adjusted under 35 U.S.C. 154(b) by 381 days.

(21) Appl. No.: 13/763,761

(22) Filed: Feb. 11, 2013

(65) Prior Publication Data

US 2013/0207520 A1    Aug. 15, 2013

Related U.S. Application Data

(60) Provisional application No. 61/597,361, filed on Feb. 10, 2012.

(51) Int. Cl.
*H01L 41/113* (2006.01)
*H02N 2/18* (2006.01)

(52) U.S. Cl.
CPC ............ *H02N 2/186* (2013.01); *H01L 41/1134* (2013.01); *H01L 41/1136* (2013.01); *H02N 2/188* (2013.01)

(58) Field of Classification Search
CPC ........................................................ H02N 2/18
USPC .......................................... 310/339, 367, 370
See application file for complete search history.

(56) References Cited

U.S. PATENT DOCUMENTS

| | | | |
|---|---|---|---|
| 2,064,911 A | 12/1936 | Hayes | |
| 3,470,394 A * | 9/1969 | Whatley, Jr. et al. | 310/334 |
| 3,816,774 A * | 6/1974 | Ohnuki et al. | 310/332 |
| 4,028,566 A * | 6/1977 | Franssen et al. | 310/358 |
| 4,387,318 A | 6/1983 | Kolm | |
| 4,467,236 A | 8/1984 | Kolm | |
| 4,999,819 A | 3/1991 | Newnham | |
| 5,276,657 A | 1/1994 | Newnham | |
| 5,512,795 A | 4/1996 | Epstein | |
| 5,729,077 A | 3/1998 | Newnham | |
| 5,751,091 A | 5/1998 | Takahashi | |

(Continued)

FOREIGN PATENT DOCUMENTS

| | | | | |
|---|---|---|---|---|
| DE | 102010016499 A1 * | 10/2011 | ............ | H01L 41/083 |
| FR | EP-2169736 A1 * | 3/2010 | .............. | H01L 41/08 |

(Continued)

OTHER PUBLICATIONS

C.P. Townsend, S.W. Arms, Wireless Sensor Networks: Principles and Applications, Sensor technology Handbook, Editor: Jon S. Wilson, publisher: Elsevier Newnes, ISBN: 0-7506-7729-5, Chapter 22, pp. 575-589, 2005.

(Continued)

*Primary Examiner* — Thomas Dougherty
(74) *Attorney, Agent, or Firm* — Marshall & Melhorn, LLC

(57) ABSTRACT

An electrical power generator has one or more serpentine elements that are made of a poled piezoelectric or electrostrictive ceramic, one or more electrically conductive shims or foils and at least two electrically conductive electrode coatings on the serpentine element. The conductive electrodes are further electrically connected to an electrical load or energy storage device or both, and the serpentine element is mechanically affixed to a source of compression or vibration or both.

31 Claims, 11 Drawing Sheets

(56) References Cited

U.S. PATENT DOCUMENTS

| | | | |
|---|---|---|---|
| 5,801,475 | A | 9/1998 | Kimura |
| 5,934,882 | A | 8/1999 | Olney |
| 6,107,726 | A | 8/2000 | Near |
| 6,111,818 | A * | 8/2000 | Bowen et al. ............... 367/140 |
| 6,194,815 | B1 | 2/2001 | Carroll |
| 6,327,855 | B1 * | 12/2001 | Hill et al. ..................... 60/528 |
| 6,407,484 | B1 | 6/2002 | Oliver |
| 6,424,079 | B1 | 7/2002 | Carroll |
| 6,725,713 | B2 | 4/2004 | Adamson |
| 6,771,007 | B2 | 8/2004 | Tanielian |
| 6,807,853 | B2 | 10/2004 | Adamson |
| 6,858,970 | B2 | 2/2005 | Malkin |
| 6,938,311 | B2 | 9/2005 | Tanielian |
| 6,947,714 | B2 | 9/2005 | Weiss |
| 6,984,902 | B1 | 1/2006 | Huang |
| 6,994,762 | B2 | 2/2006 | Clingman |
| 7,157,835 | B2 | 1/2007 | Sakai |
| 7,208,845 | B2 | 4/2007 | Masters |
| 7,239,066 | B2 | 7/2007 | Ott |
| 7,258,533 | B2 | 8/2007 | Tanner |
| 7,260,984 | B2 | 8/2007 | Roundy |
| 7,293,411 | B2 | 11/2007 | Fitch |
| 7,345,407 | B2 | 3/2008 | Tanner |
| 7,446,456 | B2 | 11/2008 | Maruyama et al. |
| 7,948,153 | B1 * | 5/2011 | Kellogg et al. ............... 310/339 |
| 2004/0078662 | A1 | 4/2004 | Hamel |
| 2005/0017602 | A1 | 1/2005 | Arms |
| 2005/0040736 | A1 * | 2/2005 | Topliss et al. ............... 310/367 |
| 2005/0225207 | A1 * | 10/2005 | Tsujiura ..................... 310/328 |
| 2006/0021261 | A1 | 2/2006 | Face |
| 2006/0129147 | A1 | 6/2006 | Biedermann |
| 2007/0263887 | A1 | 11/2007 | Tanner |
| 2007/0283769 | A1 * | 12/2007 | Glaser et al. ............. 73/862.623 |
| 2008/0074002 | A1 | 3/2008 | Priya |
| 2008/0129153 | A1 | 6/2008 | Roundy |
| 2008/0143214 | A1 * | 6/2008 | McNamara et al. ........ 310/318 |
| 2008/0246367 | A1 | 10/2008 | Fochtman |
| 2011/0074564 | A1 * | 3/2011 | Hirabayashi et al. ........ 340/447 |
| 2011/0140579 | A1 * | 6/2011 | Moon et al. ................. 310/339 |

FOREIGN PATENT DOCUMENTS

| | | | | |
|---|---|---|---|---|
| WO | WO-98-07183 | * | 2/1998 | |
| WO | WO-99-05778 | * | 2/1999 | ............... H02N 2/00 |

OTHER PUBLICATIONS

S. Roundy et al., "Improving Power Output for Vibration-Based Energy Scavengers", Pervasive Computing IEEE 2005.

S.W. Arms et al., "Power Management for Energy Harvesting Wireless Sensors," SPIE International 2005.

H.A. Sodano et al., "Comparison of Piezoelectric Energy Harvesting Devices for Recharging Batteries," J. Intelligent Material Systems and Structures, vol. 16, pp. 799-807, Oct. 2005.

D.L. Churchill et al., "Strain Energy Harvesting for Wireless Sensor Networks", Smart Structures and Materials, SPIE, vol. 5005, pp. 319-327, 200.

Torah, R., Beeby, S., and White, N., "An improved thick-film piezoelectric material by powder blending and enhanced processing parameters," IEEE Trans. UFFC 52 10-16, 2005.

Marzencki, M., Basrour, S., Charlot, B., Grasso, A., Colin, M., and Valbin, L., "Design and fabrication of piezoelectric micro power generators for autonomous Microsystems," Proc. Symp. on Design, Test, Integration and Packaging of MEMS/MOEMS DTIP05 (Montreux, Switzerland) pp. 299-302, 2005.

Jeon Y.B., Sood, R., Jeong, J-H and Kim, S.G., MEMS "Power generator with transverse mode thin film PZT," Sensors Actuators A 122, 16-22, 2005.

Roundy, S. and Wright, P.K., "A piezoelectric vibration based generator for wireless electronics," Smart Mater. Struct. 13, 1131-1142, 2004.

Roundy, S., Wright, P.K. and Rabaye, J., "A study of low level vibrations as a power source for wireless sensor nodes," Comput. Commun. 26, 1131-1144, 2003.

Sodano, H.A., Park G., and Inman, D.J., "Estimation of electric charge output for piezoelectric energy harvesting," Strain 40, 49-58, 2004.

DoD-1376B(SH) "Piezoelectric Ceramic Material and Measurements Guidelines for Sonar Transducers", Feb. 24, 1995, cancelled Jul. 13, 1999.

Near, C.D., "Piezoelectric Actuator Technology," presented at the 3rd SPIE Smart Structures and Materials Meeting, Feb. 25-29, 1996, San Diego, CA. Invited review.

"NSF-IC Power Sources Workshop," Report of a NSF-IC Workshop, Chantilly, VA, Apr. 24-25, 2005.

Near, C.D., Schmidt, G., McNeal, K., and Gentilman, R., "Injection Molded pzt Actuators," presented at the 5th SPIE Smart Structures and Materials Meeting, Mar. 1-5, 1998, San Diego, CA.

S. Roundy et al., Energy Scavenging for Wireless Sensor Networks with Special Focus on Vibrations, Kluwer Academic Press, 2004.

"Advances in Energy Harvesting Technologies," DOC2, Frost & Sullivan, Sep. 2007.

* cited by examiner

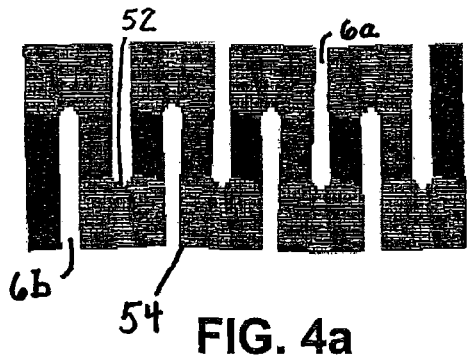
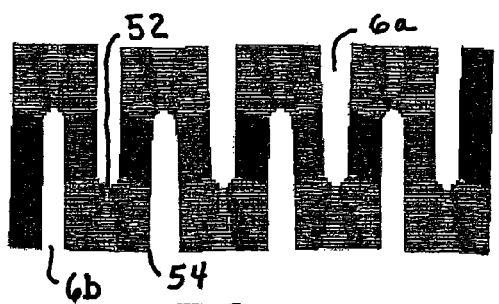
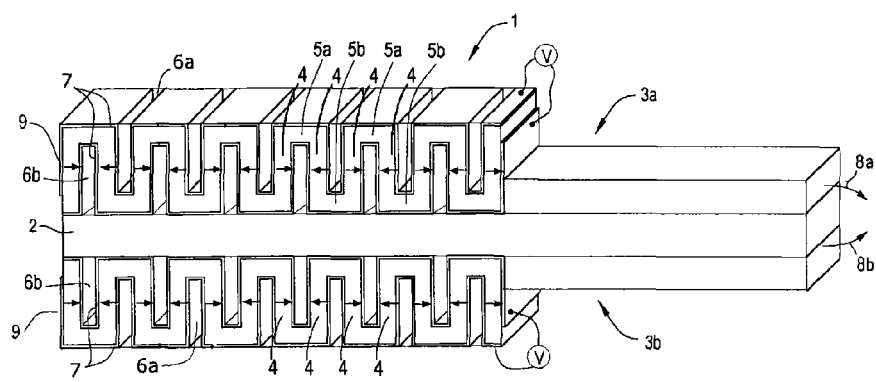
FIG. 5
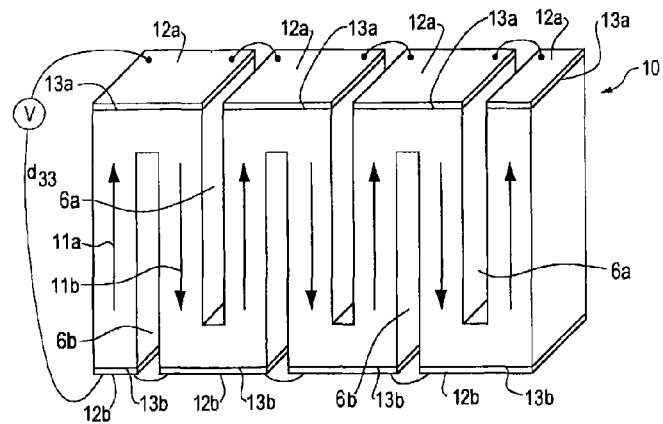
FIG. 6

POWER GENERATOR

RELATED APPLICATION

This application claims the benefit under 35 U.S.C. §119 (e) of U.S. Provisional Patent Application Ser. No. 61/597,361, filed Feb. 10, 2012, which is incorporated by reference herein in its entirety.

GOVERNMENT CONTRACT INFORMATION

The Government of the United States of America may have certain rights in this invention pursuant to Contract No. IP0839600, awarded by or for the National Science Foundation.

FIELD OF THE INVENTION

The present invention relates to a vibration energy harvester being utilized as a power generator. More particularly, the present invention relates to a vibration energy harvester, in the form of a poled piezoelectric or electrostrictive ceramic body serpentine element, being utilized as a power generator.

BACKGROUND OF THE INVENTION

By using wasted and often unwanted vibrational energy, small-scale vibrational energy harvesters have the potential of powering embedded, remote, and portable low power electronic circuits, sensors, and transmitters independent from the mains power or from a battery. Medium-scale vibrational energy harvesters have the potential of powering lighting systems. Large scale vibrational energy harvesters have the potential of powering facilities, communities, cities and regions either with grid-interactive and grid-independent operation. However, the use of conventional piezoelectric benders for vibration energy harvesters has been limited due to their low energy output, high vibrational frequency requirement, and narrow frequency bandwidth.

Currently, micro-electro-mechanical systems (MEMS) and conventional vibrational energy harvesters develop microwatt and milliwatt power levels, respectively, limiting their usage to powering MEMS sensors, ultralow power wireless sensors, or ultralow power electronic devices.

As illustrated in prior art FIG. 1a, all commercial, all patented, and most likely all developmental piezoelectric based vibrational energy harvesters are based on the same conventional monolithic bimorph energy harvester 30 that comprises a cantilever beam 32 that is made up of two piezoelectric or electrostrictive plate elements 34, 36, or some slight variation of a cantilever beam and configuration. This configuration was first developed and modeled by Jacque Curie in 1889, shortly after the discovery of piezoelectricity in 1880. This bender's construction is identical with 1938-1958 Rochelle salt and 1950s-1970s ceramic phonograph cartridge construction. The materials utilized are based on commodity materials developed in the 1960s and classified by the Defense (see DoD-Std 1376B(sh)). This cantilever beam configuration has been shown to have a number of advantages, including relatively low resonance frequencies, relatively high level of average strain for a given force input, and relatively easy and cost-competitive micro-fabrication process. As piezoelectric-based technologies have proven high volume manufacturing success, these harvesters are considered mature and adequate. Likewise, others concluded that they have the highest probability and impact of success.

Whereas, prior art piezoelectric-based power generators have adequate voltage output (high $g_{31}$), unfortunately they have suffered from low current output ($d_{31}$) and thusly low power output ($g_{31}*d_{31}$) (see piezoelectricity standard ANSI/IEEE Std. 176-1987). As shown herein in FIG. 3, these prior art generators have low energy output except at high vibrational amplitudes, narrow frequency bandwidth, and low efficiency. Table 1 below shows on the left side the prior art energy output of various MEMS, small monolithic, and large monolithic bender devices.

The following is a summary of related art: U.S. Pat. No. 7,446,456 to Xu uses a curved piezoelectric sheet in a flextensional arrangement, which increases the force and therefore the power output, but the piezoelectric sheet operates in the lowest efficiency $d_{31}$ mode.

U.S. Pat. No. 7,345,407 to Tanner uses plural cantilever bimorphs connected to a frame and the outputs of each element add up to produce more power. However, because these conventional bimorphs have low efficiency, when they are connected in parallel, this causes problems with one element discharging into the next. Therefore, each element must be wired or isolated which is complicated.

U.S. Pat. No. 7,293,411 to Fitch uses altering liquid distribution to improve the tuning of conventional bimorphs which have inherently low efficiency, wherein the tuning "tries" to maximize the output which can be accomplished either mechanically (per Fitch) or electrically. However, this will only marginally improve the bandwidth or efficiency.

U.S. Pat. No. 7,260,984 to Roundy uses a circular bimorph to harvest energy for tire pressure monitor powering. Pressure differentials in the tire versus tire rotation are utilized to harvest. This concept utilizes conventional circular bimorphs which have inherently low efficiency. U.S. Pat. No. 7,258,533 to Tanner uses a piezoelectric plate of film on a pump diaphragm to harvest energy. The film which bends similar to conventional bimorphs has inherently low efficiency.

U.S. Pat. No. 7,239,066 to Ott utilizes numerous cantilever benders in a rotating device while employing a rotator. This concept utilizes conventional cantilever benders, which have inherently low efficiency.

U.S. Pat. No. 7,208,845 to Masters uses a conventional cantilever bender to harvest energy from fluid flow, by using vortex shedding. This patent utilizes tuning of the vortex shedding to the bender with minimal flow obstruction. This concept utilizes conventional cantilever benders, but couples it to a vortex shedder.

U.S. Pat. No. 7,157,835 to Sakai uses a conventional piezoelectric bender while adding an oscillating device in order to increase mechanical motion to increase power. This concept utilizes conventional cantilever benders, which have inherently low efficiency. In addition, higher motion is provided, though the strength of the bender will limit the amount of motion amplification which can be utilized. This concept uses a different harvesting structure. However, this structure can only operate in a low efficiency mode. Also, no consideration was given to fabrication of these fibers. Fibers such as these have been proposed many times, but are thought to have never been fabricated successfully.

U.S. Pat. No. 6,994,762 to Clingman uses a single crystal piezoelectric bonded to a metal substrate in order to pre-stress the crystal. This concept utilizes single crystals rather than piezoelectric ceramic. The use of pre-stresses is well known from Paul Langevin's tonpilz (1917) to 1960s fiberglass wrapped sonar tubes to the modern Rainbow, Cerambow, and Thunder devices, which are well known.

U.S. Pat. No. 6,984,902 to Huang uses a magnetostrictive material bonded to two piezoelectric materials to make a composite transducer, which converts mechanical to electrical and mechanical to magnetic. This, however, creates a difficulty that each material has a different sign and that cancels the other unless harvested separately. In effect, this is the same as using two transducers together. In addition, due to its use of coils and permanent magnets, the magnetostrictive component will suffer from energy density.

U.S. Pat. No. 6,947,714 to Weiss uses a striker to hit conventional piezoelectric ceramic to generate energy. This concept is no different from a commercial impact igniter used for BBQ grills or gas appliances. Struck piezoelectrics can deliver high voltage, but very low current. A single piece of ceramic offers by itself low energy density. Therefore, the struck piezoelectric will have very low energy generation. In addition, the ceramic could not be struck quickly enough to generate much power. Striking is at a very low frequency compared with vibrations.

U.S. Pat. No. 6,938,311 to Tanielian uses a multiple MEMS cantilever bimorphs with multiple masses in order to have numerous natural resonance frequencies to increase bandwidth and power harvesting capability. If one conventional harvester is not efficient enough, produce enough energy, or have a wide enough bandwidth, then it is only obvious that more would be better. This is particularly true with MEMS based devices, which have very little output. Tanielian does not address the problem with low output from the harvester itself.

U.S. Pat. No. 6,858,970 to Malkin and its related U.S. Pat. No. 6,938,311, use an array of MEMS cantilever bimorphs with various masses in order to add the power generated from each bimorph at various resonances. Again, if one is not good enough, then more would be required.

U.S. Pat. No. 6,807,853 to Adamson which uses an inter-digitated 1:3 piezocomposite to harvest energy from tire rotation. This concept utilizes a different composite configuration to harvest energy. The inter-digitated 1:3 has slightly higher efficiency than a conventional bender, but will suffer from lower capacitance. Therefore, there will be greater bandwidth or ability to capture a wider range of mechanical vibration frequencies at a lower current level. As such, it has been shown that little to no improvement in energy density has been realized. The main advantage, however, is reliability or durability, albeit at a higher component cost, of which conventional harvesters would require.

U.S. Pat. No. 6,771,007 to Tanielian utilizes an array of MEMS cantilever bimorphs, as do U.S. Pat. Nos. 6,938,311 and 6,858,970, where more bimorphs are required to get more output.

U.S. Pat. No. 6,725,713 to Adamson uses an inter-digitated 1:3 piezocomposite to harvest energy from tire rotation. Related to U.S. Pat. No. 6,807,853, this concept utilizes a different composite configuration, the inter-digitated 1:3 piezoelectric composite, to harvest energy.

U.S. Pat. No. 6,424,079 to Carroll uses an undulating piezoelectric polymer, which captures mechanical energy in fluid flow through the vortexes which form due to flow over an upstream bluff body. This concept utilizes a polymer piezoelectric material, which has at least two orders of magnitude lower in power generation than the ceramic material vortexes in the fluid flow are setup to capture fluid energy.

U.S. Pat. No. 6,407,484 to Oliver uses a Class IV flextensional amplified piezoelectric ceramic to harvest energy. This concept utilizes a single or stacked Class IV flextensionals to harvest energy, which amplify stresses by approximately 4 times, and therefore provides higher power generation, which is very low for a monolithic ceramic. This technology dates back to the early days of piezoelectric technologies first done by Hayes in U.S. Pat. No. 2,064,911.

U.S. Pat. No. 6,194,815 uses a rotor with numerous piezoelectric polymer blades. This concept utilizes a polymer piezoelectric material, which is at least two orders of magnitude lower in power generation than the ceramic material. The invention here is how to capture rotational energy, which is different.

U.S. Pat. No. 5,934,882 to Olney uses a ball or oscillating striker to impact a conventional piezoelectric bimorph or multilayer device to generate energy. This concept utilizes conventional piezoelectric elements. Olney uses striker mechanisms. However, strikes or impacts produce high voltage, but low current and power, as is utilized in gas igniters. Also, the impact can seriously degrade and/or damage the material over time.

U.S. Pat. No. 5,835,996 to Hashimoto uses a rotator to impact and vibrate conventional piezoelectric elements. The elements appear to be configured as a transformer in order to gain higher voltages. This concept utilizes conventional piezoelectric elements. Though the efficiency is higher using thickness mode, it suffers by being transformed. Also, the capacitance is low and therefore so is the power generation.

U.S. Pat. No. 5,801,475 to Kimura uses a conventional piezoelectric bender which is attached to a harvesting chip. This concept utilizes a conventional harvester having a hybrid or attachment with Si-based chip. U.S. Pat. No. 5,751,091 Takahashi utilizes a conventional triangular bender which is coupled to a rotating ratchet where the triangular shape, which is well known to reduce cross-coupling through the plane of the bender.

U.S. Pat. No. 5,729,077 to Newnham uses a Class IV flextensional amplified piezoelectric ceramic with different cap or shell designs to harvest energy. This patent is related to U.S. Pat. Nos. 5,276,657 and 4,999,819 with different cap or shell designs. This concept utilizes a single or stacked Class IV flextensionals to harvest energy, which amplify stresses by approximately 4 times, and therefore provides higher power generation, which is very low for a monolithic ceramic. From the Oyster transducer patented in 1964, Newnham has taken out the mechanical attachment using a prestressing bolt and replaced it with glue joints.

U.S. Pat. No. 5,512,795 to Epstein uses a piezoelectric polymer squeezed between two rotors that utilizes a polymer film, which is at least two orders of magnitude lower power output than ceramic.

U.S. Pat. No. 5,276,657 also to Newnham uses a Class IV flextensional amplified piezoelectric ceramic to harvest energy, which is related to U.S. Pat. Nos. 5,729,077 and 4,999,819, which utilize single or stacked Class IV flextensionals to harvest energy, with a simple cap or shell design.

U.S. Pat. No. 4,999,819 to Newnham the concept uses a Class IV flextensional amplified piezoelectric ceramic to harvest energy. Related to U.S. Pat. Nos. 5,729,077 and 5,276,657, this concept utilizes a single or stacked Class IV flextensionals to harvest energy, with a simple cap or shell design.

U.S. Pat. No. 4,467,236 to Kolm uses tuned conventional rectangular or circular benders to harvest energy from the gas flow of an engine exhaust. Kolm tunes to the air flow.

U.S. Pat. No. 4,387,318 which uses an array of piezoelectric fans to generate power from air flow or wind. This '318 patent uses a piezoelectric fan in reverse resulting in a conventional bender utilized to generate low power levels.

U.S. Pat. Appl. No. 2006/0021261 to Face uses a flextensional element or one of the various bender configurations (unimorph, bimorph, Rainbow, or Thunder) to harvest footfall energy within a shoe where only the incorporation of conventional commercially available piezoelectric components are within the shoe.

U.S. Pat. Appl. No. 2006/0129147 to Thiesen uses a conventional bimorph bender with an adjustable resonance frequency due to electrostatic or electromagnetic attraction/repulsion. Thiesen couples electrostatics or electromagnetics to adjust the resonances of a conventional bender.

U.S. Pat. Appl. No. 2007/0263887 to Tanner uses a spring loaded precurved bender, probably used to lower the resonance frequency. Tanner uses the spring loading to lower the frequency.

U.S. Pat. Appl. No. 2008/0129153 to Roundy uses a mass spring loading technique to lower the resonance frequency of a conventional bimorph bender. Roundy uses the mass-spring loading to lower the frequency.

U.S. Pat. Appl. No. 2008/0246367 to Fochtman uses a conventional bender, whose surface has been modified with ridges, grooves, or holes, in order to modify the sheet stiffness and the device resonance. Changing the surface structure of the piezoelectric allows a modest degree of tuning of the stiffness and resonance of conventional benders. However, this modification would be expensive and could negatively impact reliability. Other techniques such as mass-springs would appear to be a lower cost solution.

Therefore, what is sought is a vibration energy harvester that is capable of producing significantly higher power output than comparable conventional vibration energy harvesters.

SUMMARY OF THE INVENTION

An electrical power generator comprises at least one serpentine element, comprised of a poled piezoelectric or electrostrictive ceramic, one or more electrically conductive shims or foils, and at least two electrically conductive electrode coatings on the serpentine element. The conductive electrodes are further electrically connected to an electrical load or energy storage device or both and the serpentine element is mechanically affixed to a source of compression or vibration or both.

BRIEF DESCRIPTION OF THE DRAWINGS

FIGS. 4a and 4b are respective side views of stress comparisons between compressed versus expanded serpentine piezoelectric material in accordance with the present invention;

FIG. 5 is a three dimensional view of the serpentine vibrational energy harvester of FIG. 1b showing electrical voltage;

FIG. 6 is a three dimensional view of the serpentine vibrational energy harvester with a $d_{33}*g_{33}$ polarization and operation mode through the length of the layer of FIG. 5 showing electrical voltage;

DETAILED DESCRIPTION OF THE INVENTION

Figure 1A:
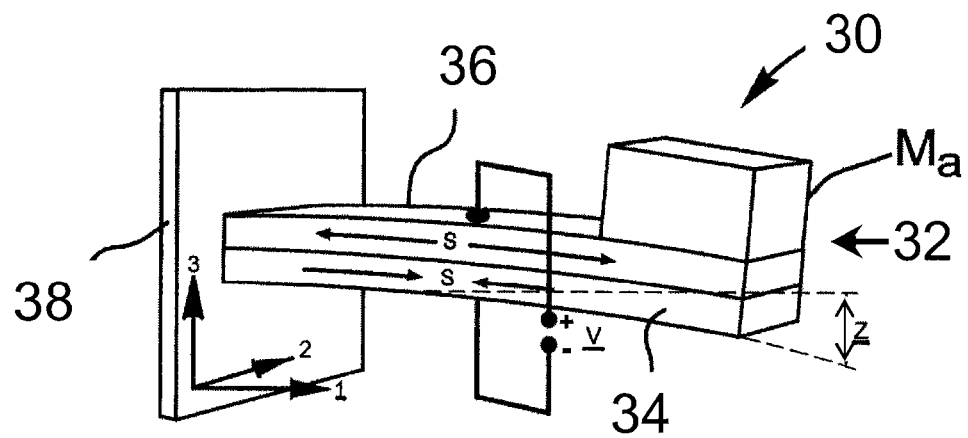
FIG. 1a is a three dimensional view of a prior art two element conventional cantilever mounted bender.

It is to be understood that the invention may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions, directions or other physical characteristics relating to the embodiments disclosed are not to be considered as limiting, unless the claims expressly state otherwise.

As mentioned above, FIG. 1a illustrates a conventional monolithic bimorph energy harvester 30 that comprises a stiff cantilever beam 32 that is made up of two elements 34, 36, with a mass $M_a$. The cantilever beam 32 is mechanically affixed to a rigid wall 38.

The present invention, however, is a serpentine energy harvester that comprises at least one serpentine layer, which comprises a poled piezoelectric or electrostrictive ceramic body, that can be embodied in the form of a beam, cantilever, or directly affixed to a substrate. FIG. 1b illustrates a cantilever embodiment of a serpentine energy harvester 40 that comprises a cantilever beam 42 that is made up of two serpentine layers 44, 46, with a shim 45 therebetween and a mass $M_b$ that is attached to the shim 45. The cantilever beam 42 is mechanically affixed to a rigid wall 48. Due to its serpentine structure the serpentine energy harvester 40 folds and unfolds in a much more flexible manner than the prior art energy harvester 30, especially as the cantilever beam 42 is made longer.

Figure 1B:
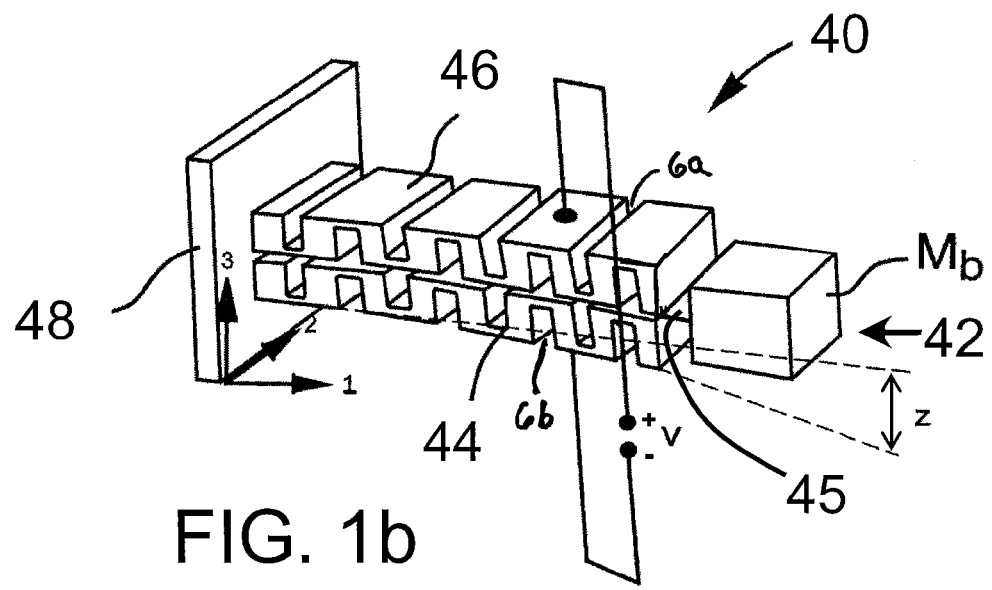
FIG. 1b is a three dimensional view of a two element cantilever mounted serpentine bender in accordance with the present invention.

Referring to FIG. 1a, as a mass $M_a$ of the prior art piezoelectric harvester 30 flexes downward there is stress S of tension in the upper element 36, as depicted by the arrows pointing outwardly from the center of the upper element 36. At the same time, there is stress S of compression in the lower element 34, as depicted by the arrows pointing inwardly to the center of the lower element 34. As a result, a voltage $\underline{V}$ is generated across (+) and (−) terminals.

On the other hand, FIG. 1*b* illustrates a mass Mb attached to the piezoelectric harvester 40 flexing downward, which produces stress of tension and compression in both of the elements 44, 46, because these elements 44, 46 are not flat and rigidly constructed as the prior art elements 34, 36. Consequently, for the present invention harvester 40, the stress due to compression and tension produced is much more complex (as illustrated in FIGS. 4*a* and 4*b*) than those for the prior art harvester 30.

Hence, it is a discovery of the present invention that not only is there a much larger electrical current (not shown but expected from U.S. Pat. No. 6,107,726 to Near, which teaches a linear actuator having a serpentine cross-section. The '726 patent to Near is incorporated herein in its entirety) produced by flexing the present invention harvester 40, but there is also a much greater voltage V generated across (+) and (−) terminals of the harvester 40, than a comparable prior art harvester 30. Hence, there is a larger amount of electrical power (i.e., current times voltage) produced.

Historically, it was known, at the time of the '726 patent, that whenever a new piezoelectric material had been found to produce more electrical current than previously known materials, it coincidentally would be found to have a lower electrical voltage. Hence, it was assumed at that time of the '726 patent that the power output of a harvester comprising a '726 patent piezoelectric structure would not increase, since it was assumed that the voltage would be expected to drop.

Years later, however, it was discovered that the electrical power produced for the present type of harvester 40 actually did significantly increase due to the fact that both the current and the voltage significantly increased.

Some additional reasons that have been found to even more increase the power output of the present invention are: 1) high stress in the corners 52, 54 (see FIG. 4*a*), 2) the serpentine structure 44, 46 folds and unfolds due to the cavities 6*a*, 6*b* (for example, the wider a cavity 6*a* the easier for the serpentine structure to spring open and closed), 3) the piezoelectric or electrostrictive ceramic material that the serpentine harvester 40 is comprised of is softer, especially along it length, thereby it lacks the stiffness of conventional harvester materials, 4) because of the serpentine structure there is more material available to produce more power, 5) due to its structure and flexibility, a harvester can be stacked at least eight times thicker than conventional harvesters, again producing more piezoelectricity, 6) the complex configuration of the serpentine energy harvester 40 possesses much larger amounts of compression and tension that are continuously produced in the elements 44, 46, and 7) due to the lower and adjustable compliance, a harvester can be made to resonant at lower frequencies and over a wider bandwidth, thereby matching or coupling to multiple or wide bandwidth vibrational modes for greater power generation.

Specifically, it has been found that the serpentine energy harvester 40 typically provides up to 30 times higher power output than a comparable conventional harvester. The serpentine energy harvester 40 has a complex micro-scale configuration, which comprises a piezoelectric or electrostrictive ceramic body that result in producing up to 9.2 times higher power output at resonance, with 3.5 times higher broadband efficiency than an equivalent conventional harvester. The serpentine energy harvester 40 produces roughly at least 0.2W/in$^2$. These results were not known at the time of the filing of U.S. patent application Ser. No. 09/041,278, which resulted in U.S. Pat. No. 6,107,727 that only discloses and claims an actuator, and which the sole inventor of the instant application was a co-inventor.

Figure 2:
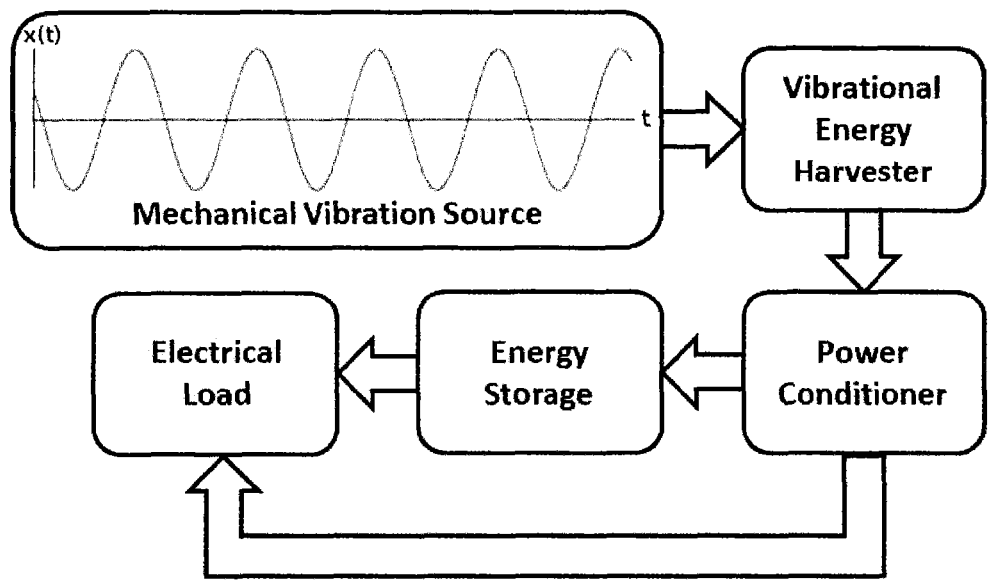
FIG. 2 is a block diagram of a power generation process associated with serpentine benders in accordance with the present invention.
Figure 3:
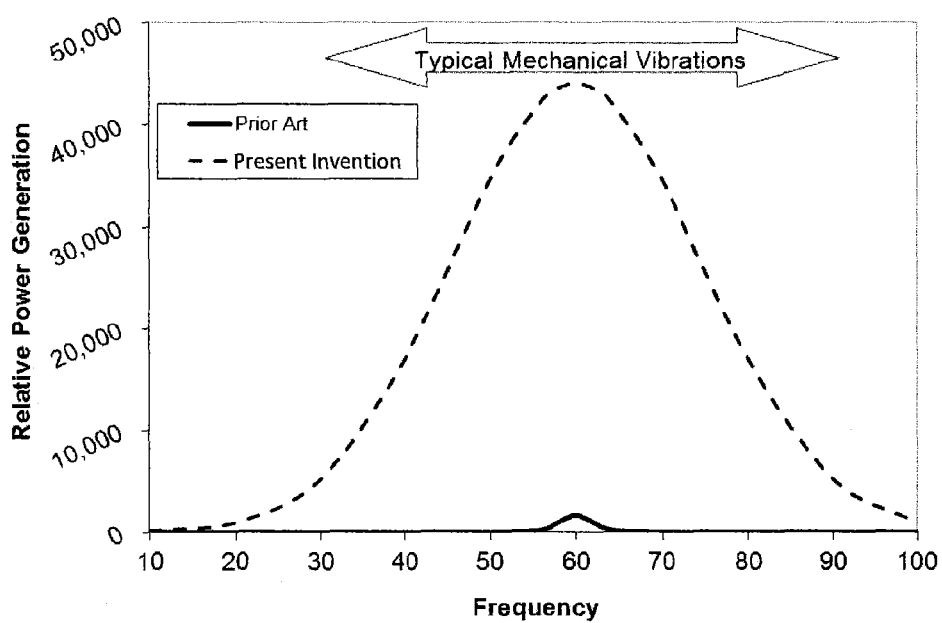
FIG. 3 is a graph comparing relative power generation output versus driving frequency between a prior art bender and the present invention.

Because of the above-stated results, the present invention's power generation would not only allow for efficient "green" power generation for very small sensors and electronic components from small scaled power generators, but also allows for low and moderate power electrical and lighting systems from medium scale power generators and for grid-interactive and grid-independent power delivery from large scale power generators. Such higher power generation eliminates the need to plug electrical systems into the AC mains for primary power, battery recharging, or battery replacement, particularly for low to moderate power embedded, remote or portable devices or systems and for moderate to high power grid-independent power delivery. This power can be gradually generated so as to be stored over time in energy storage devices such as capacitors and/or rechargeable batteries, which then can be used as "on demand" power for many devices, systems, facilities, and communities (FIG. 2).

Such harvestable vibrational energy is available for the instant harvesting from nearly everywhere, including civil structures (bridges and pipelines), transportation vehicles (airplanes, cars, trucks, and even bicycles), sidewalks (foot traffic), paths or passageways (human and animal traffic), roads (vehicular traffic), industrial or mechanical equipment (air compressors, handling equipment, pumps, rotating machinery, and HVAC equipment), and even wind and water flow from nature.

One NSF-IC workshop concluded that, in general, improvements in vibrational energy harvesters could be expected in fabrication, scale reduction, higher output materials, broader frequency bandwidth, and lower frequency regime. As shown in Table 1, this invention meets all of those expectations.

TABLE 1

Predicted energy output (μw) for prior art versus present invention devices.

| Device | Vibration Amplitude | Prior Art | Present Invention | | |
|---|---|---|---|---|---|
| | | | Device | Material | Total |
| MEMS | small | 1-10 | | | |
| Monolithic | small | 10-50 | 140-170 | 85-430 | 420-2,110 |
| Monolithic | large | 50-500 | 700-7,000 | 430-4,320 | 2,110-21,150 |

As shown in FIG. 2, a power generation system could utilize a power conditioner to either store energy or to apply the power to an electrical load directly. The present invention harvesters utilize highly efficient complex meso-scale structures. The power conditioner may be designed for low power intermittent duty and long storage time applications. Specific onboard functions include energy capture and accumulation, energy storage, power conditioning and energy management from various energy sources, such as solar cells and even vibrational energy harvesters.

The present power generator may use a super capacitor as a primary buffer and a rechargeable or flow battery as a secondary or backup buffer. The primary buffer could be the primary power source particularly for small scale systems, due to the large cycling requirements and quick discharge requirements.

The term weighted serpentine bender in a cantilever or beam mount arrangement describes the vibrational energy harvester 40. Serpentine refers to the piezoelectric plate geometry. Bender refers to the unimorph, bimorph, or multimorph configuration. Weighted refers to adding a mass to adjust the resonance frequency. Cantilever or beam mount arrangement refers to the method of mounting, where cantilever is rigidly mounted only on one side, whereas beam is mounted on two opposing sides. Substrate mount arrangement refers to the method of mounting directly on the source of compression, vibration, or both.

In the present invention, energy output has been significantly increased with lower resonance frequency and increase bandwidth for the present power generator, by fabricating and testing the present vibrational energy harvester based on a weighted serpentine bender either in a cantilever or beam mount arrangement.

The serpentine configuration was originally developed in the Near patent as a high displacement actuator. Therein, linear serpentine actuators had been tested and shown to provide actuation performance ($d_{eff}$) five times greater than $d_{33}$ mode actuators, as shown in Table 2. Despite their higher displacement performance and potential low manufacturing cost, they suffered from low force and energy output making them unable to meet many actuation requirements. Subsequently, the Near actuators were abandoned in development and not commercialized.

Specifically, years after filing the application to the Near patent, the subject sole inventor discovered that not only did the serpentine configuration have higher current output (proportional to $d_{eff}$), but also had very high voltage output (proportional to $g_{eff}$). Typically in transducer designs, there is a detrimental trade-off between these two factors, resulting in lower power output. This was not the case. In fact, due to the high stress state at the serpentine corners 52, 54, both current and voltage output improved, thereby greatly improving power output.

The subject inventor demonstrated that a serpentine shaped element increased the effective properties of these generators, including 1.4 times higher voltage, 6.6 times higher current, and 9.2 times higher power. These effective properties are higher than known properties for monolithic mode devices, since a more compliant serpentine structure folds and unfolds more easily and efficiently as it vibrates. The finite element model of FIG. 4 clearly shows this folding and unfolding nature, along with the high stress produced.

Even further performance gains are expected by the optimization of the geometric configuration, fill materials, and device constructions. As such, it is expected that the present invention vibrational energy harvester should have a tuned power generation in the 100-500 mW/in² range. In addition, novel high energy density nano-materials and high strength net-shape processing, another 3 times voltage, 3 times current, or 9 times power output improvements are expected, pushing the power generation capability to the 1W/in² as-modeled range. This potential power density level is much higher than solar, wind, conventional large benders (prior art), and batteries.

TABLE 2

Enhanced current (d), voltage (g), and power output of serpentine piezoelectric structures.

| Configuration | $K_{rel}$ (capacitance) | $s^E_{eff}$ (compliance) | $d_{eff}$ (curr.) | $g_{eff}$ (volt.) | $k_{eff}$ (effic.) (bandw.) | d * g (power) |
|---|---|---|---|---|---|---|
| Monolithic Plate | 3400 | 16.4 | 274 | 9.1 | 0.39 | 2,493 |
| ~340 μm PZT Layers with ~100 μm gaps | 14,058 | 61.6 | 1926 | 15.5 | 0.696 | 29,853 |

TABLE 2-continued

Enhanced current (d), voltage (g), and power output of serpentine piezoelectric structures.

| Configuration | $K_{rel}$ (capacitance) | $s^E_{eff}$ (compliance) | $d_{eff}$ (curr.) | $g_{eff}$ (volt.) | $k_{eff}$ (effic.) (bandw.) | d * g (power) |
|---|---|---|---|---|---|---|
| ~240 μm PZT Layers with ~160 μm gaps | 22,542 | 89.3 | 2633 | 13.2 | 0.624 | 34,756 |

The serpentine power generator 1, of FIG. 5, is fabricated from the assembly of a serpentine piezoelectric element 9 on a metallic or composite shim 2, on to which masses 3a and 3b are attached. FIG. 5 shows a bimorph-type arrangement with two serpentine piezoelectric elements 9 mounted on the shim 2. However, the device could also be fabricated in a unimorph-type arrangement with one serpentine piezoelectric element 9 mounted on a shim 2. Likewise, the device could be fabricated in a multimorph arrangement with two or more serpentine piezoelectric elements 9 mounted on each side of the shim 2. Likewise, opposing serpentine piezoelectric elements may be attached to each other without shim 2.

The serpentine piezoelectric element has multiple parallel ceramic layers 4 interconnected by bridging portions 5a and 5b at alternating ends of layers 4 to form a ceramic body of serpentine cross-section. Alternating slits or cavities 6a and 6b entering the serpentine piezoelectric element 9 from opposite side surfaces are interposed between layers 4 to separate the layers. Cavities 6a and 6b may be filled with a fluid, composite, metal, air or a soft polymer, such as an unfilled or filled, conductive or nonconductive, polyurethane or epoxy, or a vacuum may be drawn in the cavities 6a and 6b. FIG. 5 shows the layers 4 and cavities 6a and 6b having a uniform size. The device could be fabricated with varying sizes of layers 4 and cavities 6a and 6b within the same serpentine piezoelectric element 9, such as a gradual change from small to large cavities down the length of the beam, where all lengths are illustrated by vertical arrows.

FIG. 5 also shows the serpentine power generator in a regular bimorph arrangement. This regular arrangement shows the cavities 6b on the top and bottom elements aligning with one another. The device could also be fabricated with the cavities 6b on the top and bottom elements misaligned or completely out-of-phase with each other.

FIG. 5 shows the serpentine micro power generator mounted in a cantilever fashion, where the massed tip 3a and 3b is free to vibrate and the opposite surface 9 is fixed. The operation of the serpentine micro power generator is such that the massed tip 3a and 3b of the device vibrates down and up 8a and 8b, respectively, and generates a voltage V and current, which can be harvested or scavenged. Likewise, the power generator could be mounted in a beam fashion, where one or more serpentine piezoelectric elements 9 may be distributed along the beam with one or more masses 3a and 3b. Likewise, the power generator could be mounted in a substrate fashion, where one or more serpentine piezoelectric elements may be directly affixed to the source of compression, vibration, or both.

Further, FIG. 5 shows a single resonant device with a bimorph-arrangement of serpentine piezoelectric elements 1 with a mass 3a and 3b. However, the device could be fabricated with multiple resonances using two or more serpentine piezoelectric elements 1 mounted down the length of the shim 2 with two or more masses 3a and 3b mounted on top and bottom, respectively, down the length of shim 2.

Further, FIG. 5 shows a straight serpentine power generator 1 fabricated from the assembly of two straight serpentine piezoelectric elements 9 on a straight metallic or composite shim 2. However, the device could be fabricated as a curved serpentine power generator 1 (not shown). The curved device could be fabricated from one or more curved serpentine piezoelectric elements 9 on a curved metallic or composite shim.

The serpentine piezoelectric element 1 may be polarized and operated in four different configurations. Various polarization and electrode configurations allow for tailoring of the elements mechanical and electrical impedances. FIG. 6 illustrates the first type of serpentine piezoelectric element 10 which operates in the $d_{33}*g_{33}$ mode through the length of the layer. The sintered serpentine element is polarized in a known manner, e.g., by using temporary electrodes, with the polarization directions alternating in successive layers as indicated by arrows 11a and 11b. Permanent electrodes 12a are applied to surfaces 13a of the polarized ceramic body, and permanent electrodes 12b are applied to surfaces 13b. Electrodes 12a and 12b cover only surfaces 13a and 13b and do not extend into cavities 6a and 6b. Electrodes 12a and 12b are applied by conventional means, e.g., by abrading or stripping surfaces 13a and 13b to remove the temporary electrodes than applying permanent electrodes 12a and 12b by masking non-coated surfaces and electroless plating with, e.g., nickel. Alternatively, the electrodes may be vapor deposited or sputtered, e.g., with chrome-gold, or may be provided by fired silver frit or conductive polymers. Thus, the serpentine piezoelectric element 10 is provided with separate electrodes 12a and 12b, electrically isolated from one another. The polarization directions and electrode placement are selected to provide a $d_{33}*g_{33}$ mode of operation.

Figure 7:
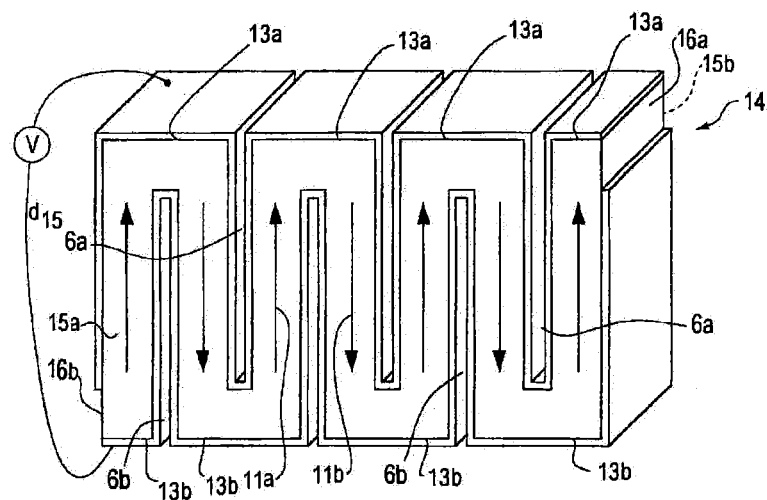
FIG. 7 is a three dimensional view of the serpentine vibrational energy harvester with a $d_{15}*g_{15}$ polarization and operation mode of FIG. 5.

FIG. 7 illustrates the second type of serpentine piezoelectric element 10 which operates in the $d_{15}*g_{15}$ mode. The sintered serpentine element 14 is polarized in a known manner, e.g., by using temporary electrodes, polarizing all of the layers in the direction indicated by arrows 11a and 11b. Permanent electrodes 15a is applied to surface 13a of the polarized ceramic body and extend into cavities 6a to cover the entire surfaces of each cavity 6a. Permanent electrodes 15b is applied to surface 13b of the polarized ceramic body and extend into cavities 6b to cover the entire surfaces of each cavity 6b. Electrodes 15a and 15b are applied as described above for electrodes 12a and 12b, electrically isolating the electrodes from one another. The polarization directions and electrode placement are selected to provide a $d_{15}*g_{15}$ mode of operation.

Figure 8:
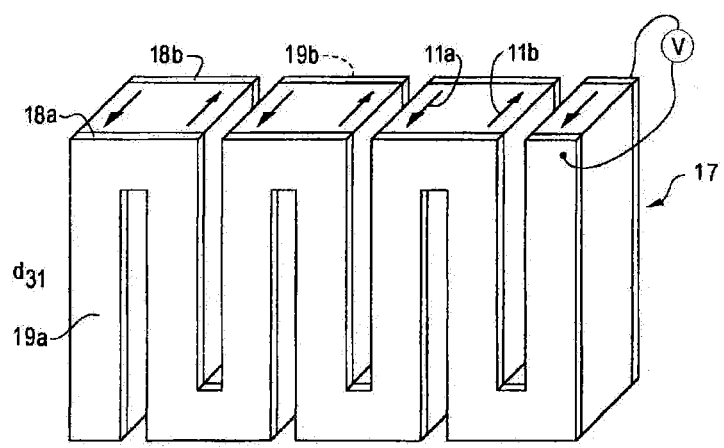
FIG. 8 is a three dimensional view of the serpentine vibrational energy harvester with a $d_{31}*g_{31}$ polarization and operation mode of FIG. 5.

FIG. 8 illustrates the third type of serpentine piezoelectric element 17 which operates in the $d_{31}*g_{31}$ mode. The sintered serpentine element 17 is poled in a known manner using temporary electrodes, with the polarization directions alternating in successive layers as indicated by arrows 11a and 11b. Permanent electrode 19a is applied to the entire surface of side 18a of the poled ceramic body, and permanent electrode 19b is applied to the entire surface of side 18b. Electrodes 19a and 19b cover only the surfaces of sides 18a and 18b and do not extend into cavities 6a and 6b. Electrodes 19a and 19b are applied as described above for electrodes 12a and 12b. Thus, the serpentine element 17 is provided with separate electrodes 19a and 19b, electrically isolated from one another. The polarization directions and electrode placement are selected to provide a $d_{31}$ mode of operation.

Figure 9:
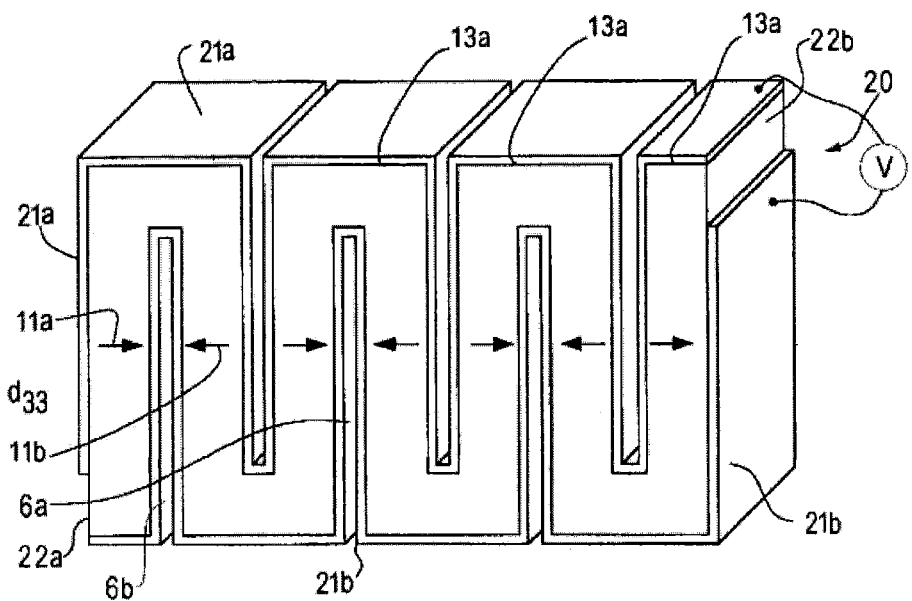
FIG. 9 is a three dimensional view of the serpentine vibrational energy harvester with a $d_{33}*g_{33}$ polarization and operation mode through the thickness of the layer of FIG. 5.

FIG. 9 illustrates the fourth type of serpentine piezoelectric element 10 which operates in the $d_{33}*g_{33}$ mode through the thickness of the layer. Sintered serpentine element is polarized in a known manner, e.g., by using temporary electrodes, with the polarization directions alternating in successive layers as indicated by arrows 11a and 11b. Permanent electrode 21a is applied to surfaces 13a and extends into cavities 6a to cover all surfaces of each cavity 6a. Permanent electrode 21b is applied to surfaces 13b and extends into cavities 6a to cover all surfaces of each cavity 6b. Electrodes 21a and 21b are applied as described above for electrodes 12a and 12b. Gaps 22a and 22b separate electrodes 21a and 21b, electrically isolating the electrodes from one another. If desired, polarization can be accomplished using permanent electrodes 21a and 21b, since the configuration of these electrodes will produce the desired polarization arrangement. However, the polarization is affected. The polarization directions and electrode placement are selected to provide a $d_{33}*g_{33}$ operation.

This invention is for a micro power generator which consists of serpentine configured bender piezoelectric vibrational energy harvester element with or without a mass physically connected to a vibration source and electrically connected to conditioning electronics to directly power electrical loads, such as electrical circuits, sensors, systems, lighting, homes, facilities, or communities, and/or to charge energy storage devices, such as capacitors or rechargeable batteries, which may be used to power the same. The mechanical connection may be either in a beam or cantilever or substrate configuration. The electrical connection may be made in either a serial or parallel configuration depending on the voltage and/or current requirement. The conditioning electronics efficiently converts the analog output of the vibrational energy harvester into a DC voltage (see FIG. 2). The DC voltage is used to power electrical loads directly and/or to charge energy storage devices through which the aforementioned electrical components are powered.

The serpentine piezoelectric element 9 may be polarized in four different configurations. Various polarization and electrode configurations allow for tailoring of the elements mechanical and electrical impedances. FIG. 6 illustrates the first type of serpentine piezoelectric element 10 which operates in the first $d_{33}*g_{33}$ mode though the length of the layer. FIG. 7 illustrates the second type of serpentine piezoelectric element 10 which operates in the $d_{15}*g_{15}$ mode. FIG. 8 illustrates the third type of serpentine piezoelectric element 17 which operates in the $d_{31}*g_{31}$ mode. FIG. 9 illustrates the fourth type of serpentine piezoelectric element 10 which operates in the $d_{33}*g_{33}$ mode through the thickness of the layer.

The serpentine piezoelectric harvesting element 9 may also have its cavities 6a and 6b filled with a fluid, air, polymer, composite, or metal, or a vacuum may be drawn in the cavities. The polymer may be soft or hard, unfilled or filled, conductive or nonconductive. The composite may be a polymer filled with electrically conductive, thermally conductive, or structurally reinforcing or softening components. The fill may be used to increase the element strength and to improve mechanical reliability. It may also be used to increase the mechanical or vibrational loading to increase electrical power output.

Table 2 illustrates that the compliance (i.e., the ability of an object to yield elastically when a force is applied) and power output of the serpentine piezoelectric harvesting element may be changed with a change in the size of the cavity and/or the change in the relative openness of the structure. The amount of curvature, motion, or vibration of the harvesting element can be adjusted or optimized down the length of the element.

Figure 10:
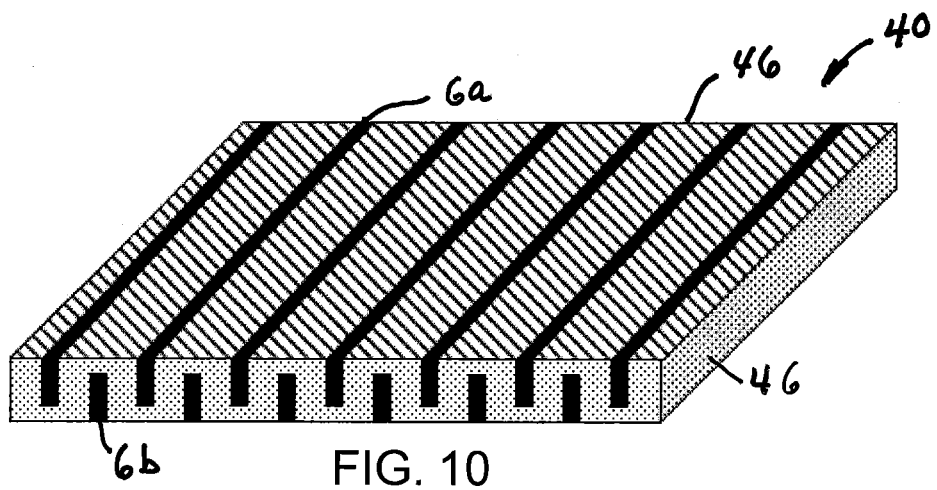
FIG. 10 is a three dimensional view of unfilled cavities of FIG. 6.
Figure 11:
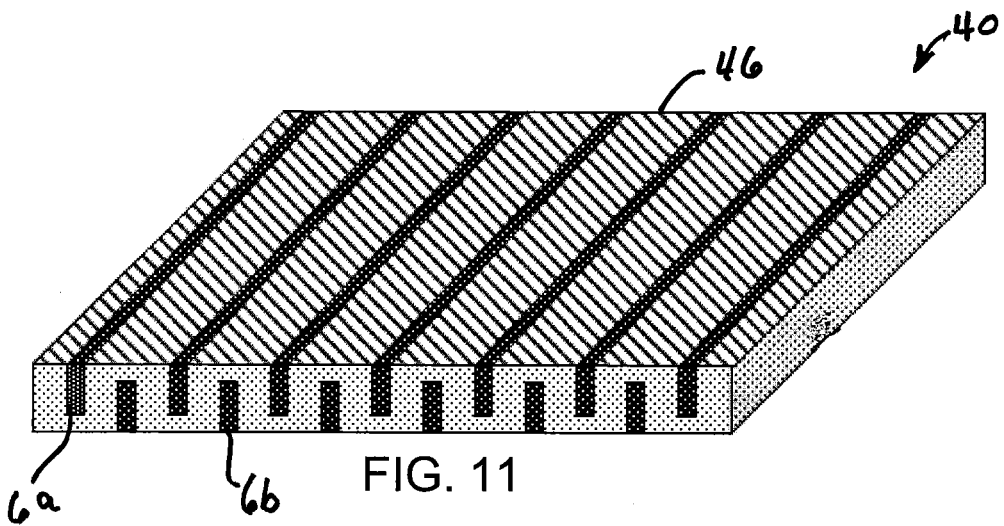
FIG. 11 is a three dimensional view of filled cavities of FIG. 6.
Figure 12:
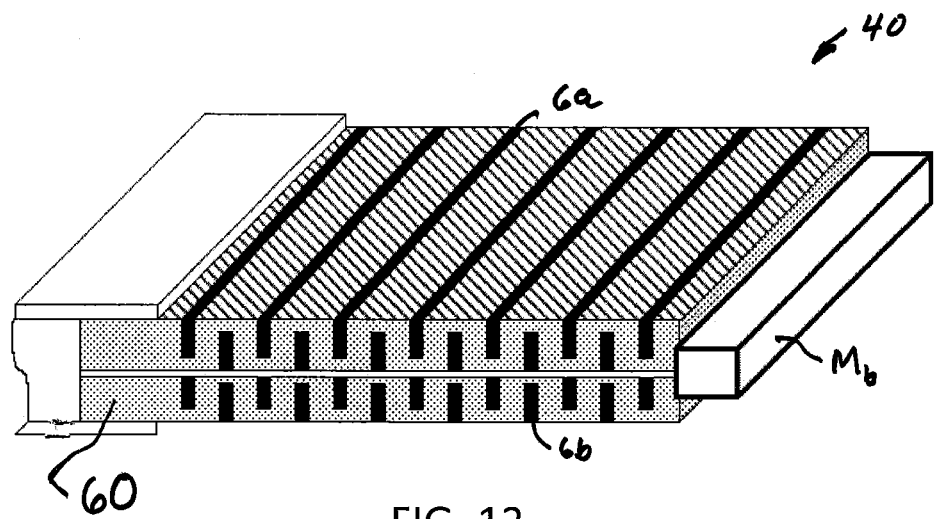
FIGS. 12-14 are three dimensional views of the serpentine energy harvester of FIG. 1b with varying cavity sizes for varying compliances within the layer.
Figure 13:
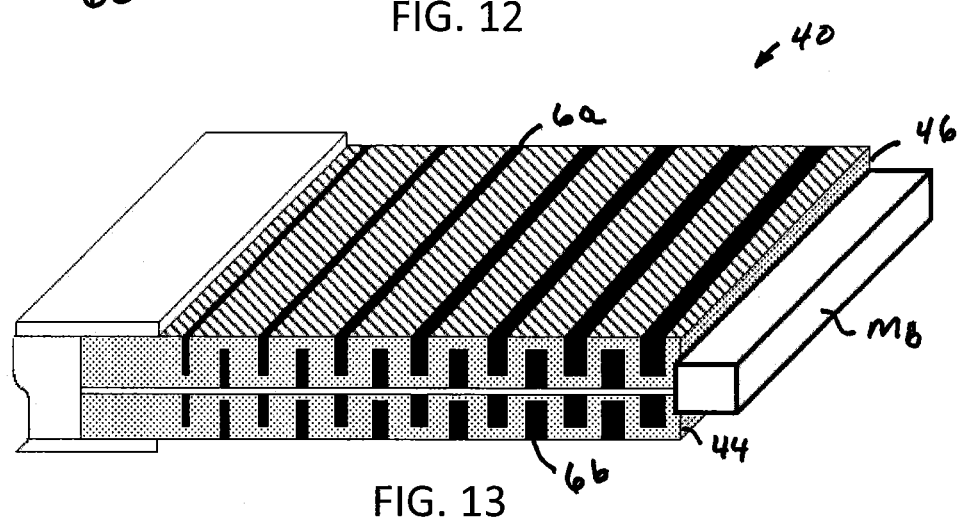
Figure 14:
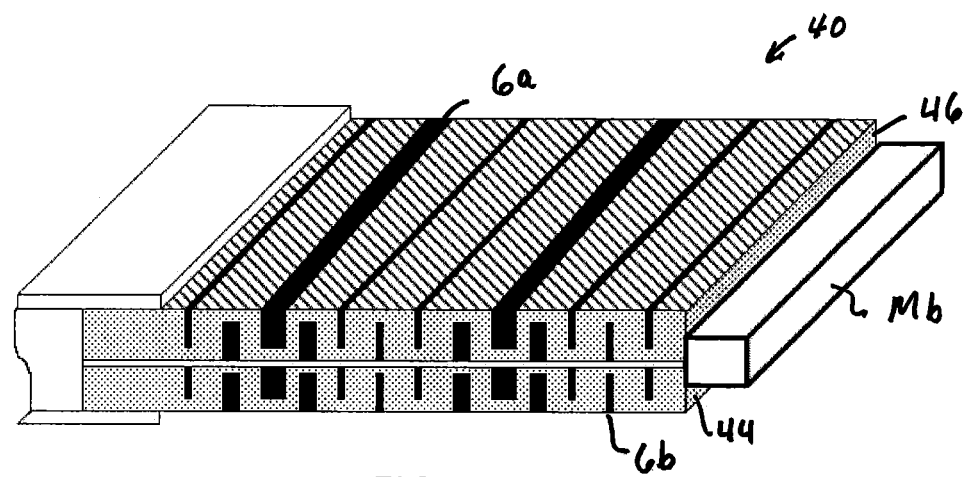

FIG. 10 is a three dimensional view of unfilled cavities of FIG. 6, while FIG. 11 is a three dimensional of filled cavities (i.e., shown as white dots therein) of FIG. 6. FIG. 12 illustrates that the element may have the same cavity 6a, 6b size through the length. FIG. 13 illustrates that the element may have a linearly increasing cavity size through the length, in order to increase the compliance down the length to increase the amount of tip bending. Likewise, the cavity size may vary with a particular function, such as a Bessel function, to increase the amount of tip bending. FIG. 14 illustrates that the element may have the cavity size may vary through the length with areas of low and high size in order to induce localized bending. Localized bending could assist in harvesting mechanical energy from moving fluids such as air or water, setting up localized eddies.

Figure 15:
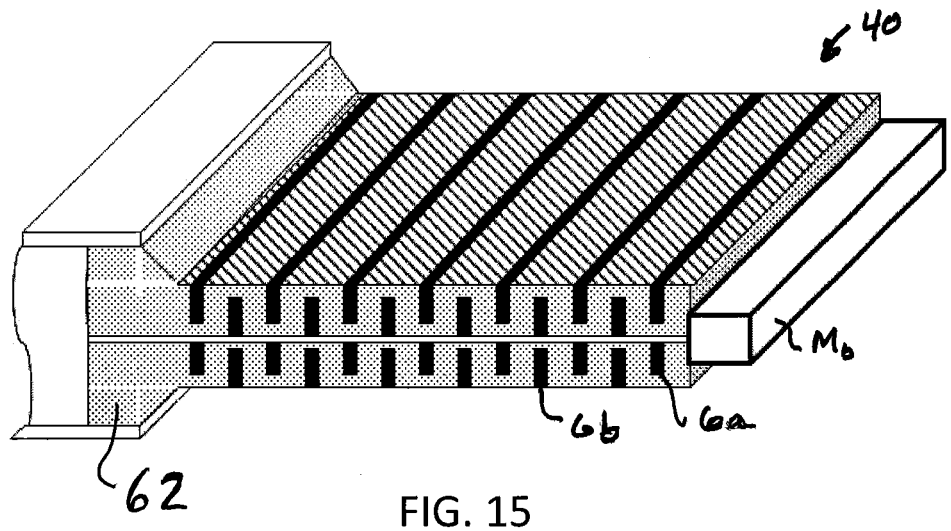
FIG. 15 is a three dimensional view of the serpentine energy harvester of FIG. 1b with a thicker root.

Vibrational energy harvesters tend to have mechanical failure at a root of the element where it is mounted to the vibrating structure. To prevent this failure mechanism, FIG. 12 illustrates the serpentine piezoelectric harvesting element with a constant cross-section, but having no cavities in its root 60. To further strengthen the root, FIG. 15 illustrates the serpentine piezoelectric harvesting element having a thicker root 62.

Figure 16:
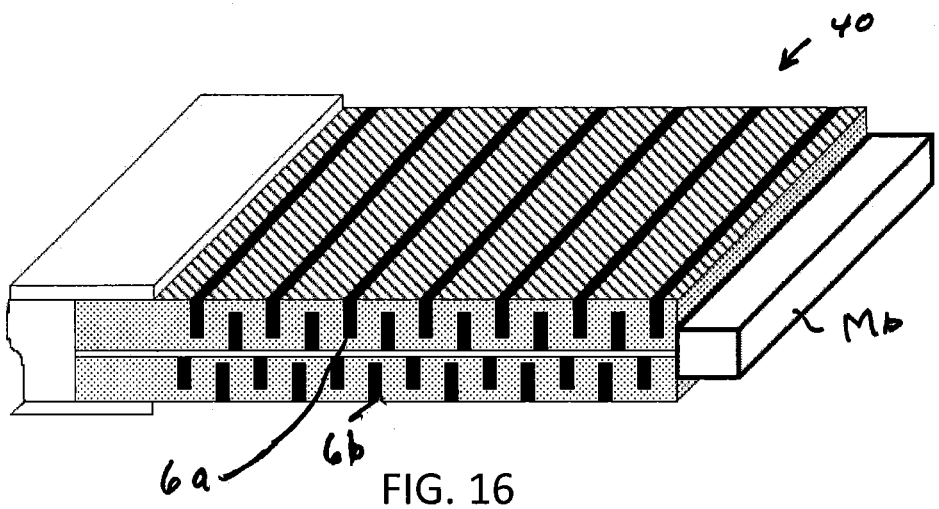
FIGS. 16-18 are three dimensional views of the serpentine energy harvester of FIG. 1b with varying phases of cavity placements.
Figure 17:
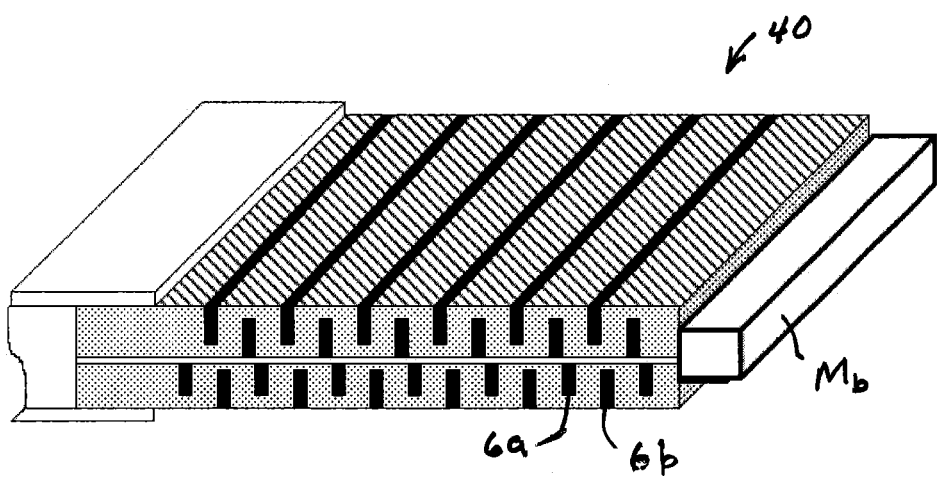
Figure 18:
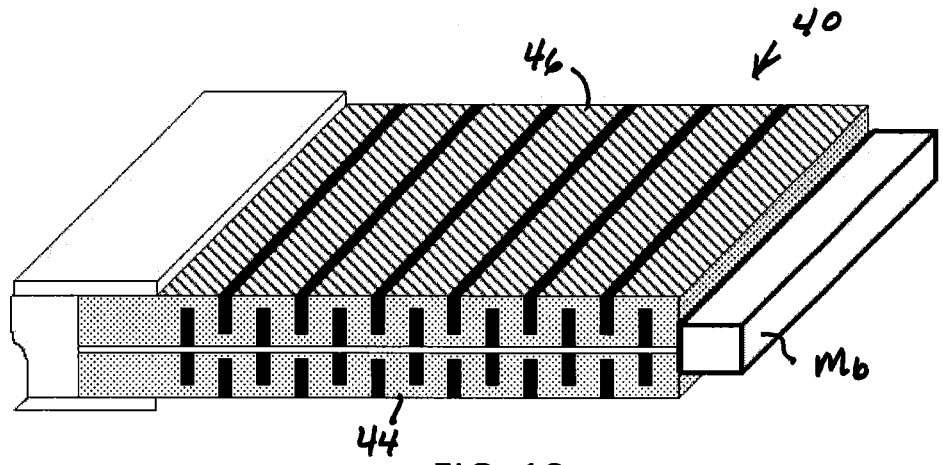

As illustrated in the bimorph bender configurations, between two layers of a bimorph or multiple layers of a multimorph, the cavity placement may be in phase (FIG. 12), out of phase (FIG. 18), or any other placement in between these two (FIG. 16 and FIG. 17). The phase of the cavity placement may be used to change or tailor the mechanical response of the vibrational energy harvester element.

Figure 19:
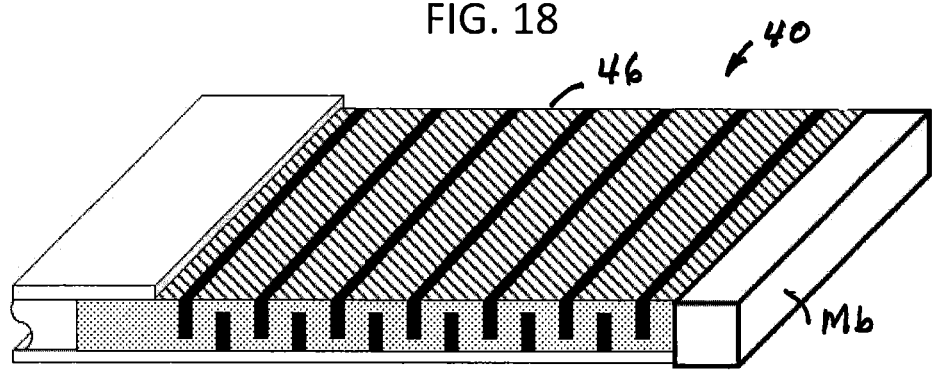
FIGS. 19-20 are three dimensional views of the serpentine energy harvester of FIG. 1b with a varying number of layers.
Figure 20:
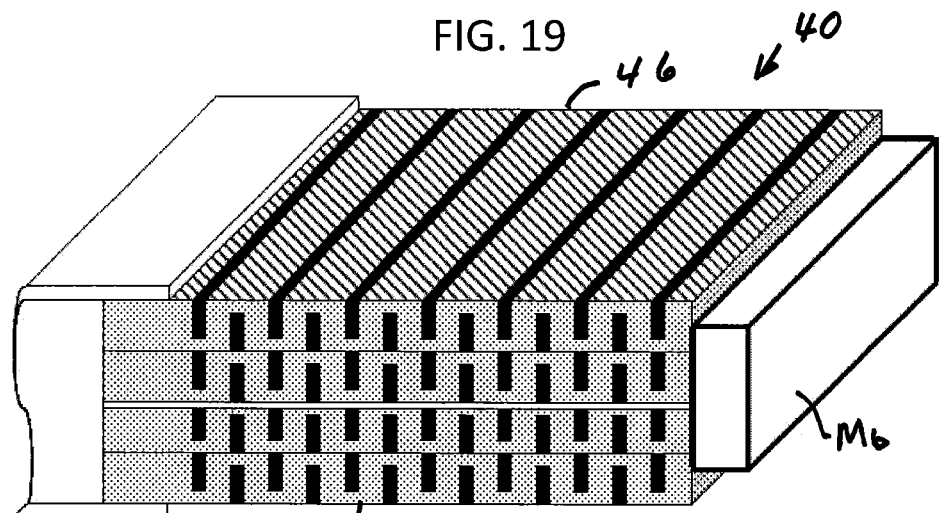
Figure 25:
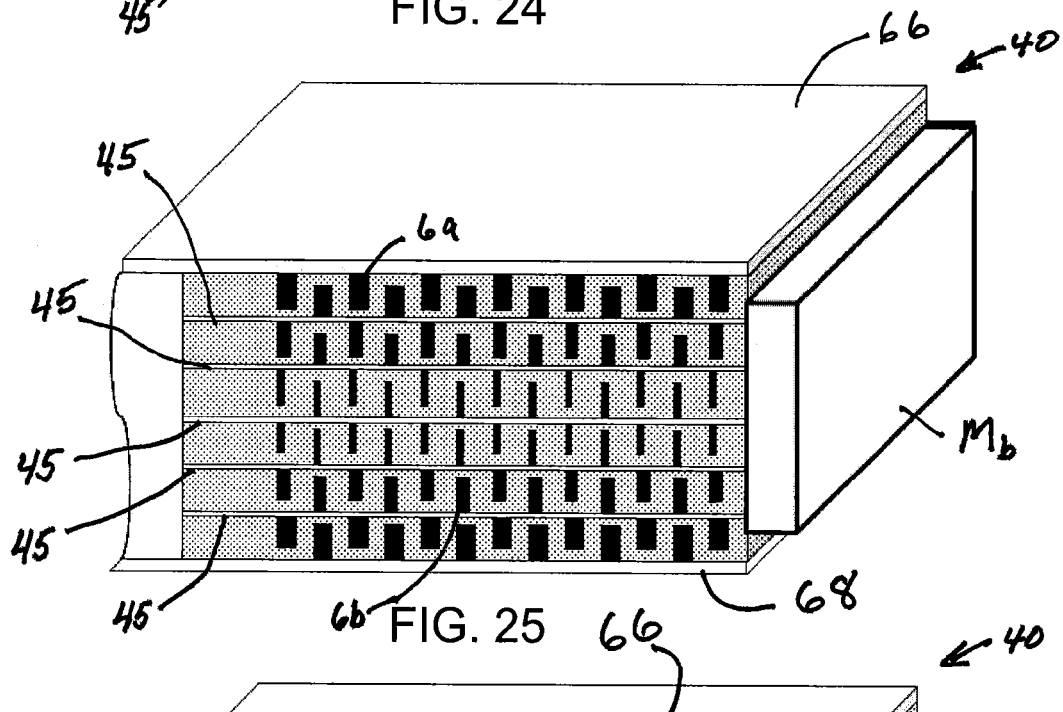

As illustrated in various figures, the vibrational energy harvesters may be configured as a unimorph (FIG. 19), bimorph (FIG. 12), or multimorph (FIG. 20). Multimorph configurations may have three or more layers on either side of the bending center, as illustrated by FIG. 25. Large multimorph configurations are allowed since the bending is not dependent on the stiffness of the serpentine piezoelectric element 9. The electrical connection of the layers may be made either in series or in parallel in order to adjust the voltage and current output of the harvester.

Figure 21:
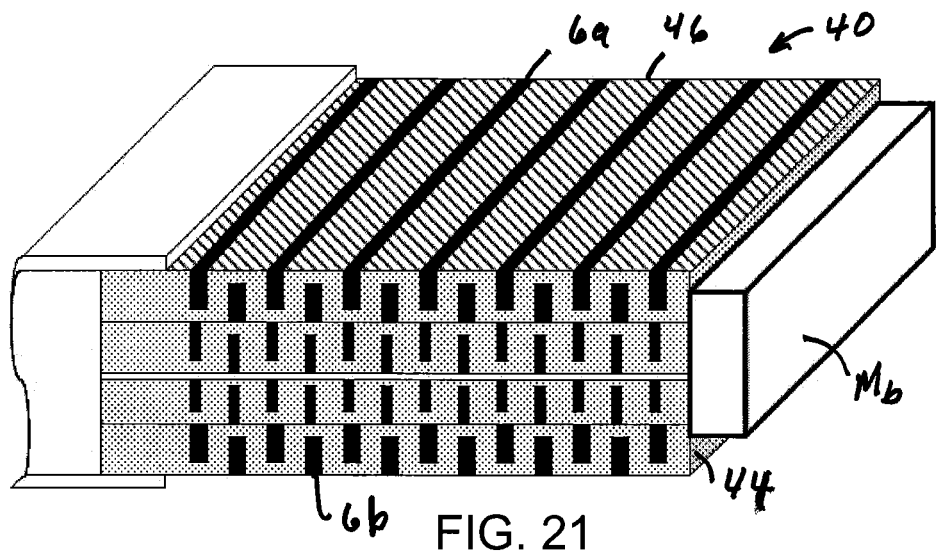
FIGS. 21-22 are three dimensional views of the serpentine energy harvester of FIG. 1b with varying compliance of the layers and within the layers.
Figure 22:
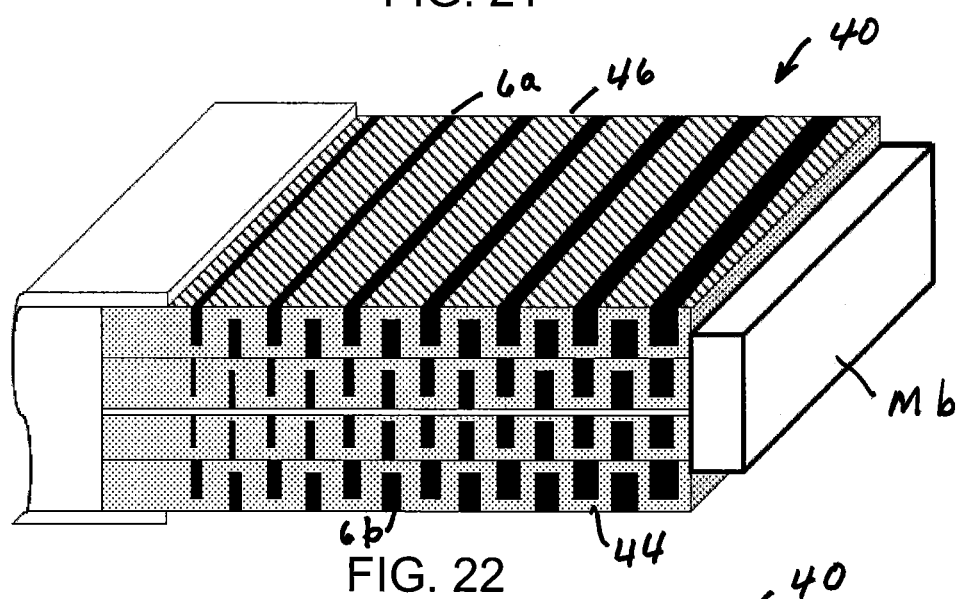

As illustrated other various figures, the compliance of the various layers of a multimorph may be changed in order to provide higher amounts of bending. FIG. 21 illustrates a multimorph with higher compliant (i.e., wider cavities) outer layers in order to provide greater bending than a multimorph with the same compliance on the outer layers (FIG. 20). As illustrated by FIG. 22, the change in compliance of the outer layers of the multimorph can be accomplished also with the change in compliance down the length of the element.

Also, as illustrated in various figures, the compliance of the various layers of a multimorph may be changed in order to provide higher amounts of bending. FIG. 21 illustrates a multimorph with higher compliant (i.e., wider cavities) outer layers in order to provide greater bending than a multimorph with the same compliance on the outer layers (FIG. 20). As illustrated by FIG. 22, the change in compliance of the outer layers of the multimorph can be accomplished also with the change in compliance down the length of the element.

Figure 23:
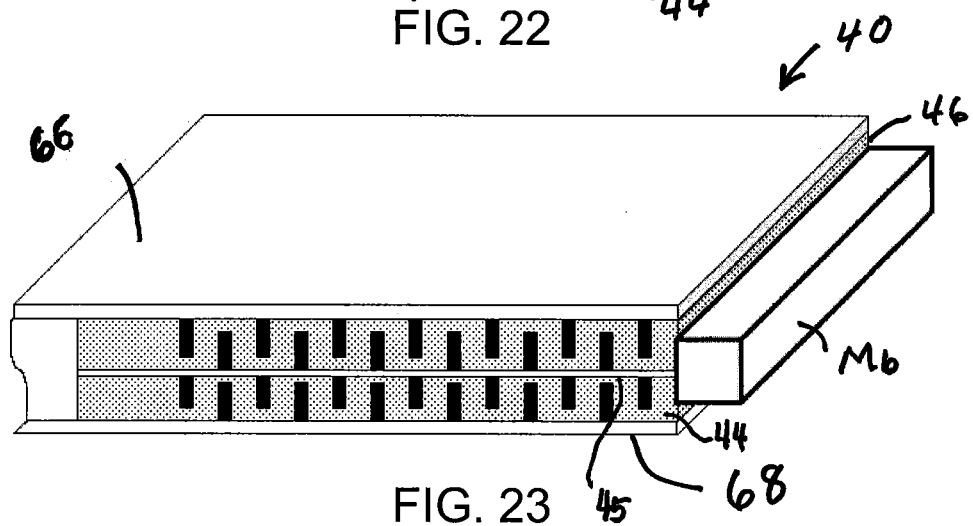
FIGS. 23-25 are three dimensional views of the serpentine energy harvester of FIG. 1b with varying layers with shims.
Figure 24:
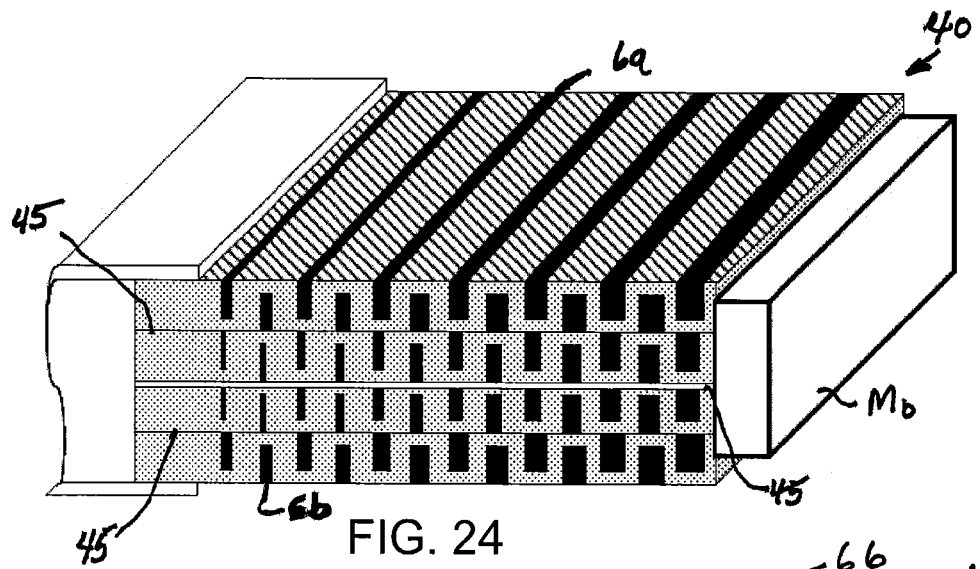
Figure 26:
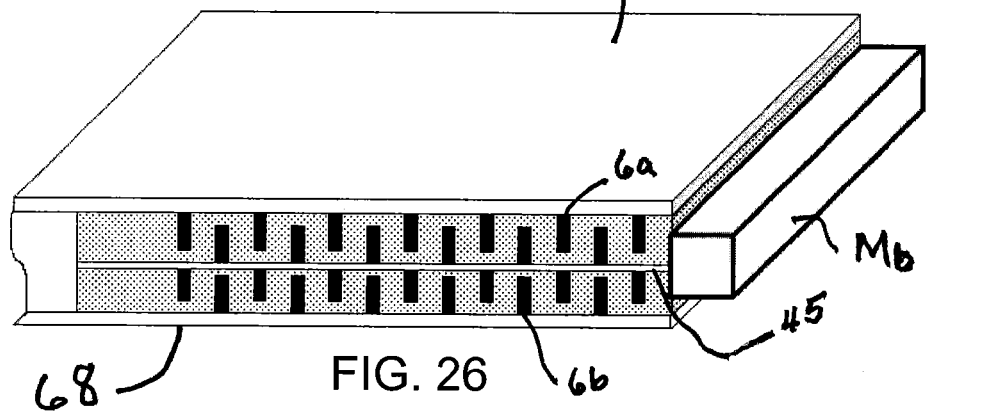
FIG. 26 is a three dimensional view of the serpentine energy harvester of FIG. 1b but with a different mode.

As modeled in FIG. 4a, the serpentine vibrational energy harvesting element has high stress concentrations about the corners 52 and 54 of the cavities 6a, 6b. In order to minimize or prevent premature failure and/or to allow for passive failure at the corners 54, the elements may utilize metal shims or foils 66 and 68 attached to the outer layers of the serpentine piezoelectric elements 9 as illustrated in FIG. 23, FIG. 25, and FIG. 26. These shims or foils 66 and 68 may also be attached to various layers of a multimorph as illustrated in FIG. 25, and FIG. 26. The shims may be attached causing little to no residual stress or a compressive stress in the harvesting element. The residual compressive stress or prestressing of the harvester element will help prevent premature mechanical failure.

Likewise, the entire vibrational energy harvester may be encapsulated (not shown but common in the art). The encapsulant will help protect the elements from moisture, water, and/or other contaminant. The encapsulation may be used also to provide for a residual compressive or prestressing of the harvester.

Figure 27:
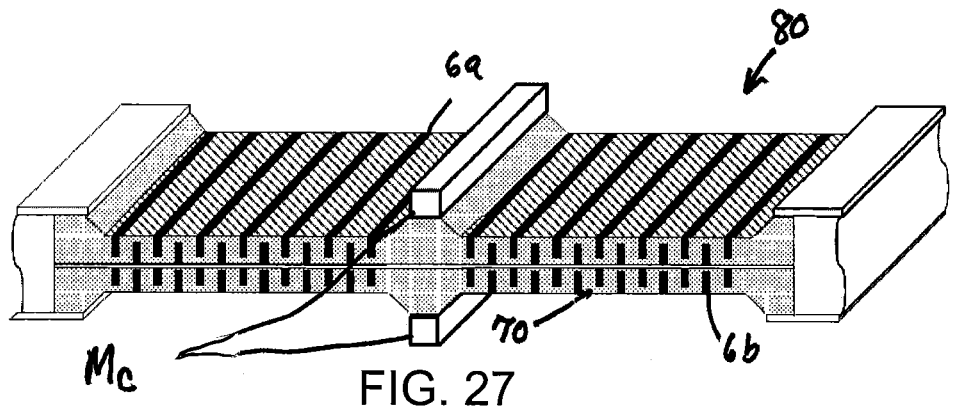
FIGS. 27-29 are three dimensional views of the basic serpentine energy harvester of FIG. 1b in the form of beams.
Figure 28:
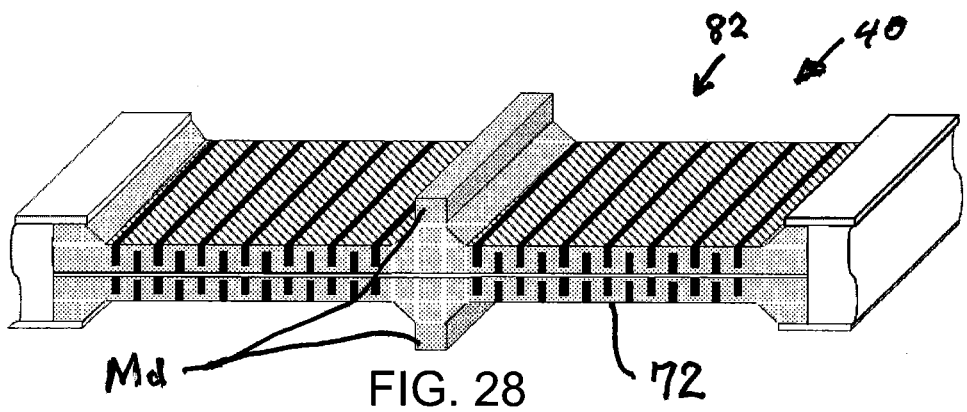
Figure 29:
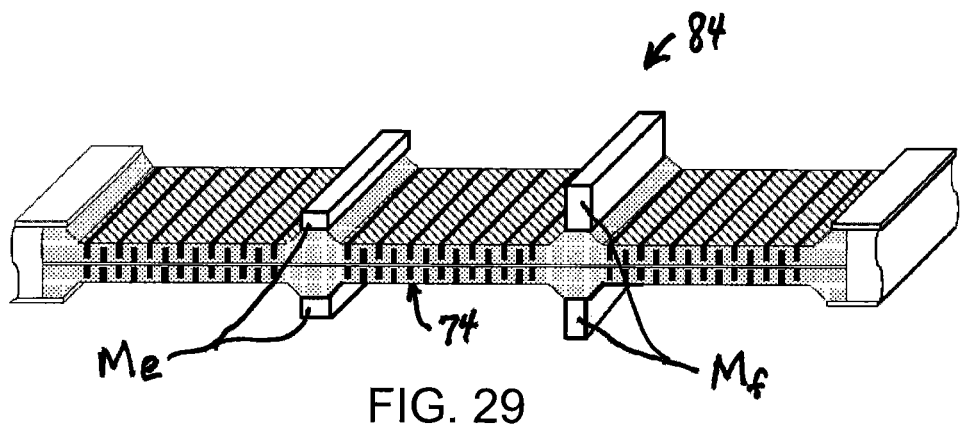

As illustrated in FIGS. 26-29, the vibrational energy harvester may be mounted as in either a cantilever 40 (FIG. 26) or beam configuration 80 (FIG. 27). The mass $M_b$ may be a weight attached to the middle shim 45 (FIG. 26) or a mass $M_c$ to a serpentine element 70 of the beam 80 (FIG. 27). If mounted on the serpentine element 70, as illustrated in FIG. 27, the element 70 may have a different cross section in order to support the mass $M_c$ and to prevent or reduce premature failure due to localized flexing. The mass $M_c$ may be a different material (FIG. 27) or may be the same material as the serpentine element 72 of the beam 82 (FIG. 28). FIG. 26, FIG. 27, and FIG. 28 illustrate the use of masses $M_b$, $M_c$, $M_d$ having a single resonance mode. Beam mounted harvesters 80, 82, 84 may use elements of different lengths in order to provide for multiple resonance modes. Likewise, as illustrated by FIG. 29, the energy harvester 84 with element 74 may utilize two or more masses $M_e$, $M_f$ with the same or different lengths of elements in order to have two or more resonance modes. Multiple resonance modes may be used in either the cantilever or beam configurations.

It is to be understood that the invention may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions, directions or other physical characteristics relating to the embodiments disclosed are not to be considered as limiting, unless the claims expressly state otherwise.

What is claimed is:

1. An electrical power generator comprising:
    at least one serpentine element having high stress state corners and formed as one piece throughout its thickness, comprised of a poled piezoelectric or electrostrictive ceramic;
    one or more electrically conductive shims or foils and at least two electrically conductive electrode coatings on the serpentine element;
    wherein the conductive electrodes are further electrically connected to an electrical load or energy storage device or both and the serpentine element is mechanically affixed to a source of compression or vibration or both; and
    wherein the electrical power generator has a high voltage output proportional to $g_{eff}$ and has a tuned power generation of at least 100 mW/in$^2$.

2. The electrical power generator in claim 1, wherein the serpentine element is mechanically affixed at one or both ends to the source of compression or vibration or both.

3. The electrical power generator in claim 1, wherein the serpentine element is affixed directly to the source of compression or vibration or both.

4. The electrical power generator in claim 1, further comprising at least one mass mechanically affixed to an end or middle of the serpentine element.

5. The electrical power generator in claim 1, further comprising at least one mass comprised of a monolithic section of the piezoelectric or electrostrictive ceramic.

6. The electrical power generator in claim 1, further comprising at least one serpentine element covered on its top and bottom with the electrically conductive shim or foil.

7. The electrical power generator in claim 1, wherein the serpentine element comprises alternating layers electroded and polarized in a $d_{33}*g_{33}$ mode through the length of the layer.

8. The electrical power generator in claim 1, wherein the serpentine element comprises alternating layers electroded and polarized in a $d_{15}*g_{15}$ mode.

9. The electrical power generator in claim 1, wherein the serpentine element comprises alternating layers electroded and polarized in a $d_{31}*g_{31}$ mode.

10. The electrical power generator in claim 1, wherein the serpentine element comprises alternating layers electroded and polarized in a $d_{33}*g_{33}$ mode through the thickness of the layer.

11. The electrical power generator in claim 1, wherein the serpentine element comprises alternating slits or cavities filled with a fluid, polymer, composite, or metal, or having a vacuum therein.

12. The electrical power generator in claim 1, wherein the serpentine element comprises alternating slits or cavities having increasing size down the length of the element.

13. The electrical power generator in claim 1, wherein the serpentine element comprises alternating slits or cavities having sizes that vary from small to large in various areas down the length of the element.

14. The electrical power generator in claim 1, further comprising a solid or monolithic piezoelectric or electrostrictive ceramic body at one or both ends of the electrical power generator, wherein the electrical power generator is affixed to the source of compression, vibration or both or upon which is mounted one or more masses.

15. The electrical power generator in claim 1, further comprising a solid or monolithic piezoelectric or electrostrictive ceramic body at one or both ends of the electrical power generator, wherein the electrical power generator is affixed to the source of compression, vibration, or both or upon which is mounted one or more masses having a thicker cross section than the cross section of the serpentine element having alternating slits or cavities.

16. The electrical power generator in claim 1, wherein two or more serpentine elements are bonded together having a relative placement of the alternating slits or cavities in phase, out of phase, or shifted relative to one another.

17. The electrical power generator in claim 1, wherein four or more serpentine elements are bonded together, wherein outer serpentine elements comprise alternating slits or cavities being larger in size than alternating slits or cavities of inner serpentine elements.

18. The electrical power generator in claim 1, wherein four or more serpentine elements are bonded together, wherein outer serpentine elements comprise alternative slits or cavities being larger in size than alternating slits or cavities of the inner serpentine elements.

19. A method of generating electrical power comprising:
providing at least one serpentine element having high stress state corners and formed as one piece throughout its thickness, comprised of a poled piezoelectric or electrostrictive ceramic, two or more electrically conductive electrode coatings, and one or more electrically conductive shims or foils on the serpentine element;
electrically connecting the conductive electrode coatings to an electrical load or energy storage device or both; and
mechanically affixing the serpentine element to a source of compression or vibration or both;
wherein the mechanical compression or vibration or both causes an electrical power generator to bend or flex, thereby stretching and contracting the serpentine element and producing electrical power; and
wherein the electrical power generator has a high voltage output proportional to $g_{eff}$ and has a tuned power generation of at least 100 mW/in$^2$.

20. The method of generating electrical power in claim 19, further comprising sharply forming the corners of the serpentine element so as to highly stress the serpentine element, thereby producing greater electrical power.

21. The method of generating electrical power in claim 19, further comprising stiffening the serpentine element along the serpentine element length less than along the serpentine element width, thereby allowing greater bending along the length of the serpentine element.

22. The method of generating electrical power in claim 19, further comprising mis-matching stiffness of bending layers, thereby allowing more or thicker amounts of poled piezoelectric or electrostrictive ceramic so as to produce more electrical power.

23. The method of generating electrical power in claim 19, further comprising varying electroding and polarizing modes, thereby controlling electrical voltage and current.

24. The method of generating electrical power in claim 19, further comprising adjusting the relative size of the alternative slits or cavities and layers of the serpentine element, thereby controlling electrical voltage and current.

25. The method of generating electrical power in claim 19, further comprising adjusting the relative size of the alternative slits or cavities and layers of the serpentine element, thereby controlling stiffness of the serpentine element so as to match resonance frequency of the source of vibration.

26. The method of generating electrical power in claim 19, further comprising affixing one or more masses at vary lengths so as to match one or more resonance frequencies of the serpentine element-mass pair, thereby matching one or more resonance frequencies of the source of vibration.

27. The method of generating electrical power in claim 19, further comprising adjusting the relative size of alternate slits or cavities so as to control the stiffness of layers of the serpentine element, thereby matching the acoustic impedance of a source of vibration.

28. The method of generating electrical power in claim 19, further comprising adjusting the size of alternate slits or cavities or layers or both down the length of the serpentine element so as to control the serpentine element stiffness, thereby maximizing bending of the serpentine element.

29. The method of generating electrical power in claim 19, further comprising locally adjusting the relative size of alternative slits or cavities or layers or both of the serpentine element so as to control stiffness of the serpentine element, thereby causing localized bending.

30. The method of generating electrical power in claim 19, further comprising providing lower stiffness to outer serpentine elements and higher stiffness to inner serpentine elements, thereby varying bending between the outer and inner serpentine elements of the electrical power generator.

31. The electrical power generator in claim 1, wherein the poled piezoelectric or electrostrictive ceramic serpentine element has sharply formed corners.

* * * * *